US006917084B2

(12) United States Patent
Baum et al.

(10) Patent No.: US 6,917,084 B2
(45) Date of Patent: Jul. 12, 2005

(54) INTERDIGITATED LAYOUT METHODOLOGY FOR AMPLIFIER AND H-BRIDGE OUTPUT STAGES

(75) Inventors: David R. Baum, Tucson, AZ (US); Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 10/656,451

(22) Filed: Sep. 5, 2003

(65) Prior Publication Data

US 2005/0051853 A1 Mar. 10, 2005

(51) Int. Cl.[7] .............................................. H01L 27/02
(52) U.S. Cl. ....................... 257/401; 257/206; 257/390; 327/410; 438/128; 438/199
(58) Field of Search ................................ 257/202, 204, 257/206, 341, 390, 401; 438/128, 199; 327/408, 410; 716/8, 10

(56) References Cited

U.S. PATENT DOCUMENTS

| | | | | |
|---|---|---|---|---|
| 5,220,187 A | * | 6/1993 | Miyaoka et al. | ............ 257/378 |
| 5,459,340 A | * | 10/1995 | Anderson et al. | ........... 257/203 |
| 5,489,860 A | * | 2/1996 | Kitagawa et al. | ........... 326/103 |
| 5,737,170 A | | 4/1998 | Moyer | ........................ 361/103 |
| 6,566,720 B2 | * | 5/2003 | Aldrich | ....................... 257/369 |
| 2002/0070391 A1 | * | 6/2002 | Possley | ....................... 257/202 |

OTHER PUBLICATIONS

Burr–Brown OPA2544 Circuit Diagram, Drawing No. CD09693, dated May 24, 1994.

* cited by examiner

Primary Examiner—Tom Thomas
Assistant Examiner—N. Drew Richards
(74) Attorney, Agent, or Firm—W. Daniel Swayze, Jr.; W. James Brady; Frederick J. Telecky, Jr.

(57) ABSTRACT

A complementary output stage in integrated circuit includes a P-channel transistor (MP1) the segmented into a first group of sections (MP1-1,2 . . . 12) and an N-channel transistor (MN1) segmented into a second group of sections (MN1-1,2 . . . 12). The sections of the first group are disposed in a plurality of N-type well regions (35), respectively, and the sections of the second group are disposed in a plurality of P-type well regions (36), respectively. The sections of the first group are alternately located with respect to the sections of the second group so as to form an interdigitated output stage area of the integrated circuit including the P-channel transistor (MP1) and the N-channel transistor (MN1) so that the higher amount of heat normally generated in the N-channel transistor is dissipated over the entire interdigitated output stage area and reduces peak temperatures in the N-channel transistor.

27 Claims, 5 Drawing Sheets

INTERDIGITATED LAYOUT METHODOLOGY FOR AMPLIFIER AND H-BRIDGE OUTPUT STAGES

BACKGROUND OF THE INVENTION

The present invention relates generally to thermal dissipation in output stages for integrated circuits, and more particularly to segmenting high-current P-channel transistors and high-current N-channel transistors of various integrated circuits such as amplifiers and H-bridge circuits and alternating or "interdigitating" the segmented sections to reduce peak temperatures in the transistors. The invention also relates to providing a uniform temperature profile in the integrated circuit chip and to reducing harmonic distortion and noise and undesirable thermal shutdown caused by excessive peak temperatures and/or thermal gradients caused thereby in an integrated circuit.

In general, the temperatures in regions of integrated circuit output stages in which N-channel output transistors are located are substantially higher than the temperatures in regions in which P-channel output transistors designed to conduct the same amount of current are located. This is because the amount of integrated circuit chip area occupied by an N-channel transistor of a particular current-carrying capability is much lower than the amount of chip area occupied by a P-channel transistor of the same current-carrying capability. The heat generated in an N-channel transistor conducting a high current must flow through the thermal resistance between the chip area occupied by the N-channel transistor and the bottom surface of the chip which is "die bonded" to a metal lead frame through which the heat must be dissipated to prevent excessively high temperature in the transistor. The thermal resistance is inversely proportional to the chip area occupied the transistor. Consequently, heat generated in the inherently-smaller-area N-channel transistor must flow through thermal resistance which is much higher than the thermal resistance through which heat generated in the higher area P-channel transistor must flow, so the temperature in the N-channel transistor may be much higher than in the P-channel transistor conducting the same amount of current. This causes thermal gradients which are different across the chip. It is known that thermal feedback resulting from such thermal gradients can cause changes in offset voltages and create nonlinear offset shifts that cause signal distortion.

More specifically, the power generated in the N-channel or P-channel transistor is equal to the current flowing through the transistor multiplied by its drain-source voltage VDS. The area of the N-channel transistor is roughly one-third to one-fourth the area of a P-channel transistor having the same current-carrying capability, depending on the integrated circuit manufacturing process being used. Therefore, the thermal resistance between the N-channel transistor and the back of the chip is much higher than the thermal resistance between the P-channel transistor and the back of the chip, so heat generated in the N-channel transistor does not flow through the thermal resistance nearly rapidly as from the P-channel transistor to the lead frame. Consequently, the temperature of the N-channel transistor may rise to a much higher level, resulting in "hot spots" in the N-channel transistors during high current operation (while the rest of the chip remains at a much lower temperature). The hot spots can result in destruction of the N-channel transistor.

The maximum acceptable temperature for any transistor in many CMOS integrated circuit chip designs is approximately 150 degrees centigrade. To prevent destruction of the N-channel transistor peak temperatures above 150 degrees centigrade, many integrated circuits include thermal shutdown circuits that detect excessively high temperature in high-power N-channel output transistors and automatically "shut down" the integrated circuit by turning off the output transistors before a critical temperature sufficiently high to cause destruction of the integrated circuit is reached.

Until now, the main solutions to the foregoing problem have been to either de-rate the maximum operating power of the integrated circuit or to use a "thermal spreader" such as a beryllium or copper pad or substrate attached between the bottom of the integrated circuit chip and the lead frame to which the chip is attached. However, de-rating the maximum operating power reduces the number of applications in which the integrated circuit can be used and also reduces the price that the market is willing to pay for the integrated circuit. And using a thermal spreader or heat sink is undesirably costly.

It would be very desirable to avoid the need for an integrated circuit to go into a thermal shutdown mode as a result of the temperature of a single N-channel output transistor becoming unacceptably high while the rest of the integrated circuit remains at a much lower and completely safe operating temperature.

There is an unmet need for an improved integrated circuit that avoids the occurrence of premature "hot spots" in N-channel transistors of complementary output circuit stages.

There also is an unmet need for an improved integrated circuit that inexpensively avoids premature thermal shutdown without substantially increasing the cost of the integrated circuit.

There also is an unmet need for an integrated circuit output stage having complementary N-channel and P-channel output transistors which avoids the need to use thermal spreaders or heat sinks, such as beryllium or copper thermal spreaders, in order to avoid excessively high hot spot temperatures.

There also is an unmet need for an integrated circuit output stage having complementary N-channel and P-channel output transistors which avoids the need to de-rate the maximum operating power of the integrated circuit in order to avoid the premature occurrence of excessively high hot spot temperatures.

There also is an unmet need to create uniform temperature gradients emanating from an integrated circuit output stage to avoid temperature distortions affecting offsets and thereby causing various degradations of circuit performance.

SUMMARY OF THE INVENTION

It is an object of the invention to provide an improved integrated circuit that avoids the occurrence of premature "hot spots" in N-channel transistors of complementary output circuit stages.

It is another object of the present invention to provide an improved integrated circuit that avoids premature thermal shutdown without substantially increasing the cost of the integrated circuit.

It is another object of the invention to provide an integrated circuit output stage having complementary N-channel and P-channel output transistors which avoids the need to use thermal spreaders, such as beryllium, copper, or aluminum thermal spreaders and/or heat sinks in order to avoid excessively high hot spot temperatures.

It is another object of the invention to provide an integrated circuit output stage having complementary N-channel and P-channel output transistors which avoids the need to de-rate the maximum operating power of the integrated circuit in order to avoid the premature occurrence of excessively high hot spot temperatures.

Is another object of invention to provide an integrated circuit output stage that avoids non-uniform heating and thermal gradients and thereby avoids degradation of various kinds of circuit performance caused by non-uniform heating and thermal gradients.

Briefly described, and in accordance with one embodiment, the present invention provides an integrated circuit including a P-channel transistor (MP1) composed of a first group of sections (MP1-1,2 . . . 12), and also including an N-channel transistor (MN1) composed of a second group of sections (MN1-1,2 . . . 12), and a gate. The sections of the first group are disposed in a plurality of N-type well regions (35), respectively, wherein the source regions in the first group all are electrically connected together, the drain regions in the first group all are electrically connected together, and the gates in the first group all are electrically connected together. The sections of the second group are disposed in a plurality of P-type well regions (36), respectively, wherein the source regions in the second group all are electrically connected together, the drain regions in the second group all are electrically connected together, and the gates in the second group all are electrically connected together. The sections of the first group are alternately located with respect to the sections of the second group so as to form a checkerboard pattern in an interdigitated output stage area of the integrated circuit including the P-channel transistor (MP1) and the N-channel transistor (MN1) so that a higher amount of heat normally generated in the N-channel transistor is dissipated over the entire interdigitated output stage area in order to reduce peak temperatures in the N-channel transistor.

In one embodiment, a fully differential amplifier (60) includes a first differential input stage (61) including a first interdigitated output stage (50-1) including the interdigitated P-channel transistor and N-channel transistor, and also includes a second differential input stage (62) including a second interdigitated output stage (50-2) substantially similar to the first interdigitated output stage.

In the described embodiment, the integrated circuit includes a temperature-sensing transistor (Q1) of a thermal shut-down circuit located within a hot spot region in which the approximately the highest temperatures would be most likely to occur during operation of the integrated circuit. The shut-down circuit (20) is configured to turn off the P-channel transistor (MP1) and the N-channel transistor (MN1) for at least a predetermined amount of time if the temperature within the hot spot region increases to a predetermined level that activates the shut-down circuit (20).

DETAILED DESCRIPTION OF THE PREFERRED EMBODIMENTS

Figure 1A:
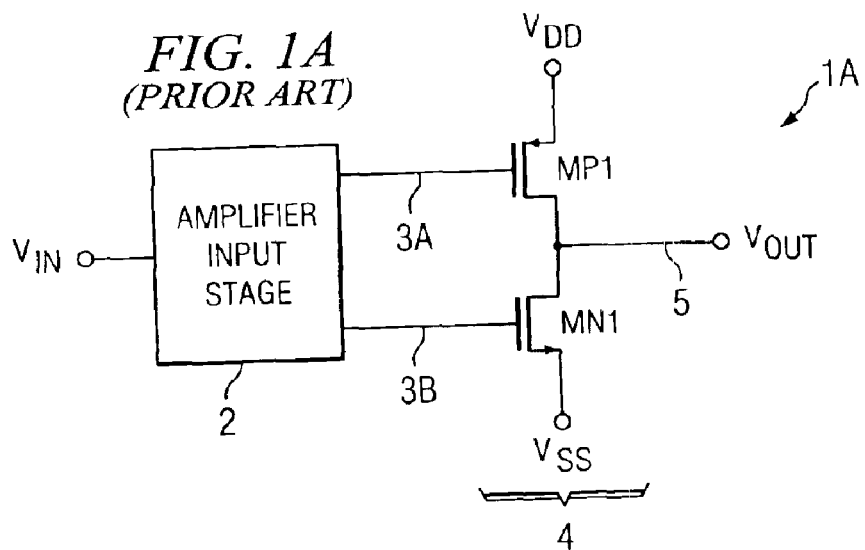
FIG. 1A is a schematic diagram of a generalized prior art amplifier having a complementary output stage.

FIG. 1A shows a conventional amplifier 1A that includes an input amplifier stage 2 which generates output stage drive signals on conductors 3A and 3B in response to an input voltage Vin. Amplifier 1A includes a complementary output stage 4 including a P-channel output transistor MP1 and an N-channel output transistor coupled in series between supply voltages VDD and VSS. The gate of transistor MP1 is connected to conductor 3A, its source is connected to VDD, and its drain is connected to an output conductor 5 on which the output signal Vout is produced. The gate of transistor MN1 is connected to conductor 3B, its source is connected to VSS, and its drain is connected to output conductor 5. Typically, a conventional thermal shut down circuit is coupled to conductors 3A and 3B to turn off transistors MP1 and MN1 if the detected temperature in transistor MN1 is above a predetermined threshold value, for example 160 degrees centigrade, and to allow transistors MP1 or MN1 to be turned on again for normal operation when the temperature in transistor MN1 decreases sufficiently.

Figure 6:
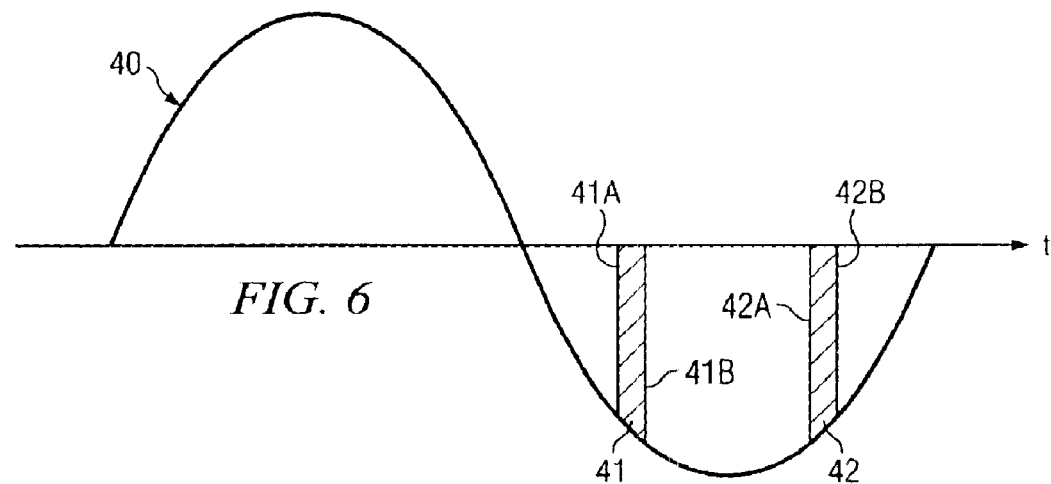
FIG. 6 is a diagram of a slow Vout sine wave signal useful in explaining how undesirable thermal shut-down can occur in the prior art circuit of FIG. 1A.

Referring next to FIG. 6, sine wave 40 represents a hypothetical low-frequency sinusoidal output waveform of Vout that can be produced by complementary output stage 4 in FIG. 1A. The output signal Vout is assumed to be driving a relatively low impedance load (not shown) on conductor 5 such that a large load current is being delivered by output transistors MP1 and MN1 to the low impedance load.

During the positive portion of sine wave 40, P-channel output transistor MP1 is on, an N-channel transistor MN1 is off. Because of the large amount of chip area occupied by transistor MP1, heat generated in transistor MP1 is easily dissipated through the chip region under it, so there is no danger of a heat buildup causing unacceptably high peak temperatures in transistor MP1.

However, heat would not be as quickly dissipated through the much smaller area under N-channel transistor MN1, so the peak temperature in a hot spot within transistor MN1 during the negative portion of sine wave 4 builds up beyond a threshold temperature that causes thermal shut-down circuit to turn off output transistors MP1 and MN1 at the time indicated by dashed line 41A. That prevents further power from being dissipated in N-channel transistor MN1, so the temperature in the hot spot region rapidly decreases, and the thermal shut-down circuit allows transistors MP1 and MN1 to be operated normally in response to Vin. Such shut-down operation can occur one or more times in the region 41 between dashed lines 41A and 41AB. After the time represented by dashed line 41B, the voltage across transistor MN1 has decreased to a sufficiently low value that the amount of power being dissipated in transistor MN1 is easily dissipated, causing the temperature in the hot spot region to be low enough that at the time represented by dashed line 42B the output current again has been reduced enough that when the output current is multiplied by the VDS voltage across transistor MN1, the resulting power being generated in transistor MN1 is sufficiently low that the thermal shut-down circuit does not turn off transistors MP1 and MN1 again until the next negative portion of sine wave 40.

Figure 1B:
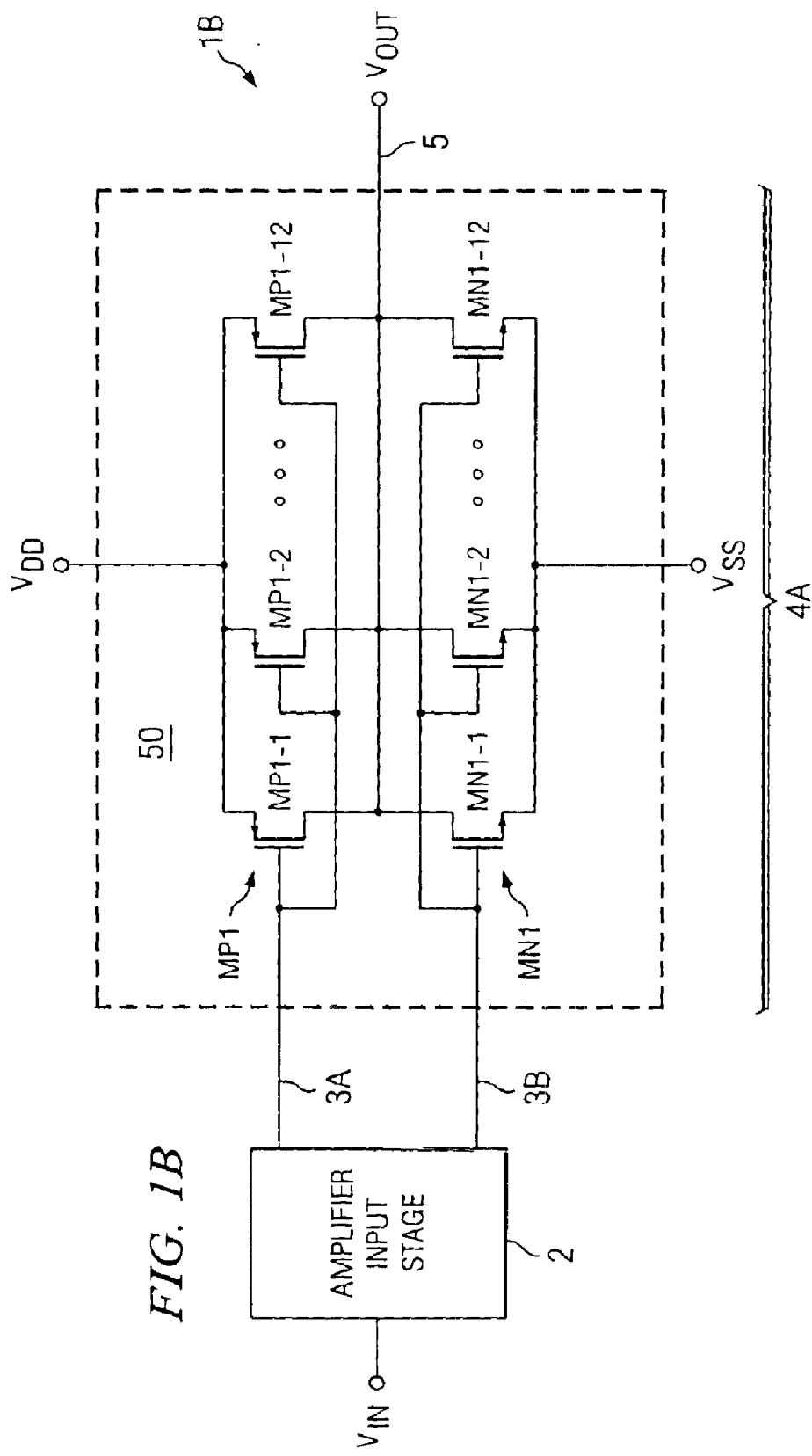
FIG. 1B is a schematic diagram of an amplifier having a complementary output stage wherein the P-channel output transistor and the N-channel output transistor are segmented and the sections are interdigitated into a common integrated circuit chip area.
Figure 3:
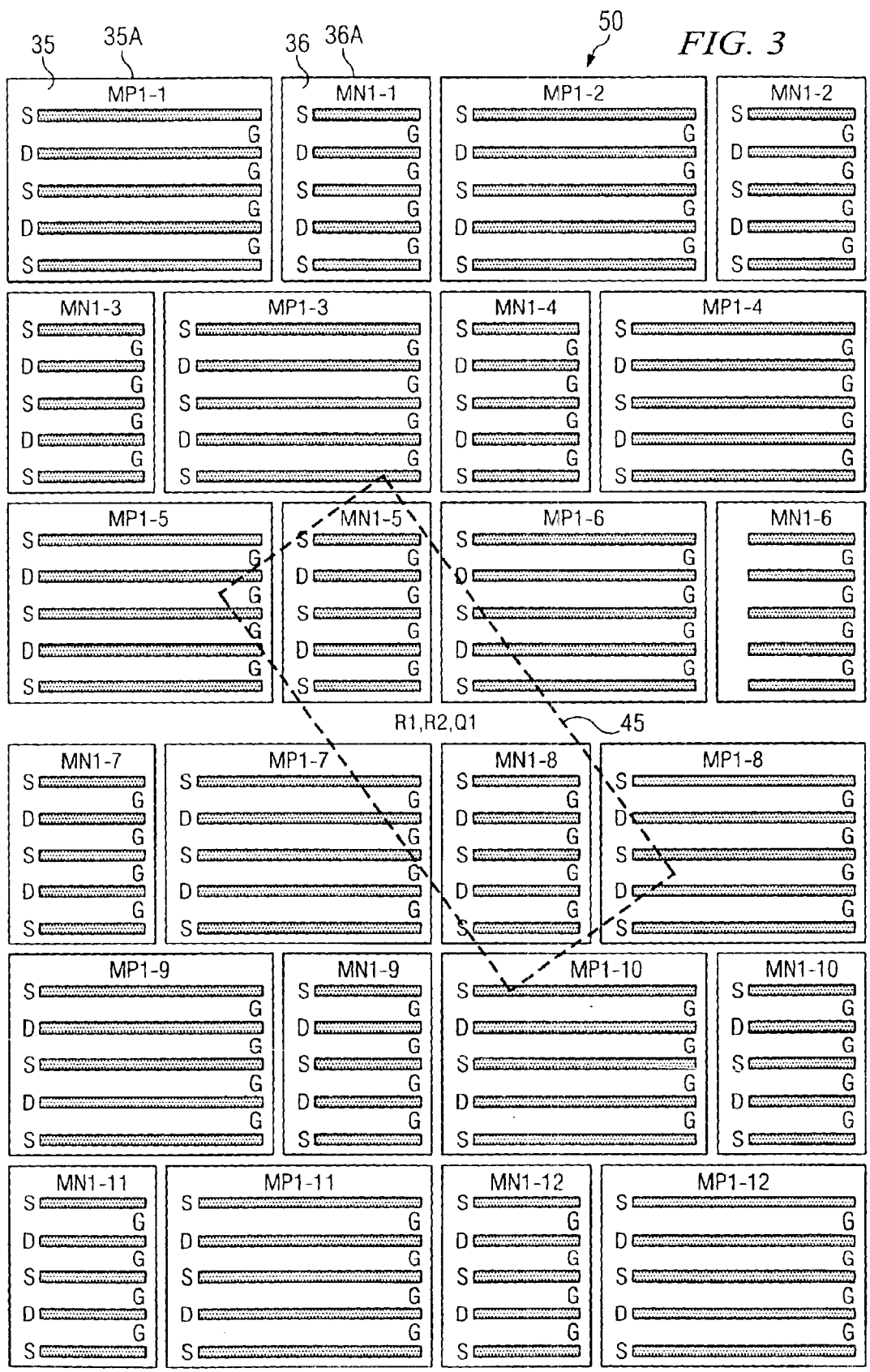
FIG. 3 is a diagram of the topology of the sections of the P-channel transistor and the N-channel transistor of output transistor stage 4A are arranged in a checkerboard pattern in the chip area 50 shown in FIG. 1B.

Referring to FIG. 1B, an integrated circuit amplifier 1B according to the present invention is similar to above described prior art integrated circuit amplifier 1A, except that in the complementary output stage 4A of amplifier 1B, the output transistors MP1 and MN1 are segmented and the resulting sections are alternated or "interdigitated" to form a checkerboard pattern within an integrated circuit area 50, shown in FIG. 3 in order to reduce peak temperatures in a "hot spot" region in N-channel transistor MN1.

Specifically, output transistor MP1 is segmented into 12 identical sections M1-1,2 . . . 12 and output transistor MN1 is segmented into 12 identical sections M1-1,2 . . . 12, all located according to the checkerboard pattern within the area 50 as shown in FIG. 3

Figure 2A:
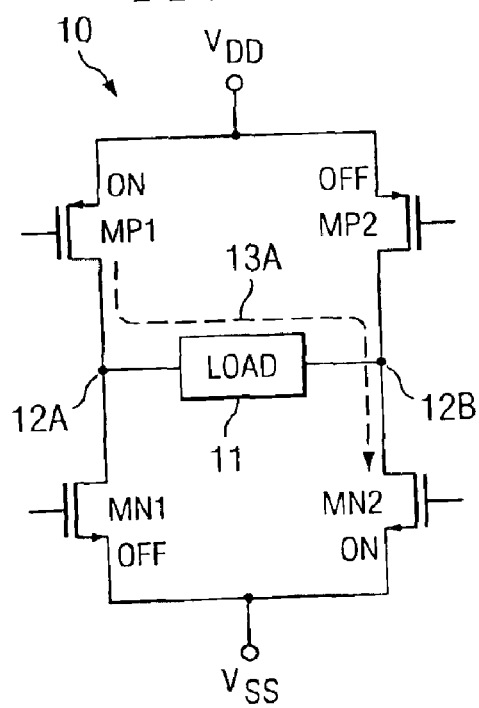
FIGS. 2A and 2B are schematic diagrams illustrating operation of an H-bridge circuit wherein the pairs of P-channel an N-channel transistors which can be simultaneously turned on during normal operation are segmented and the sections are interdigitated into common integrated circuit chip areas.
Figure 2B:
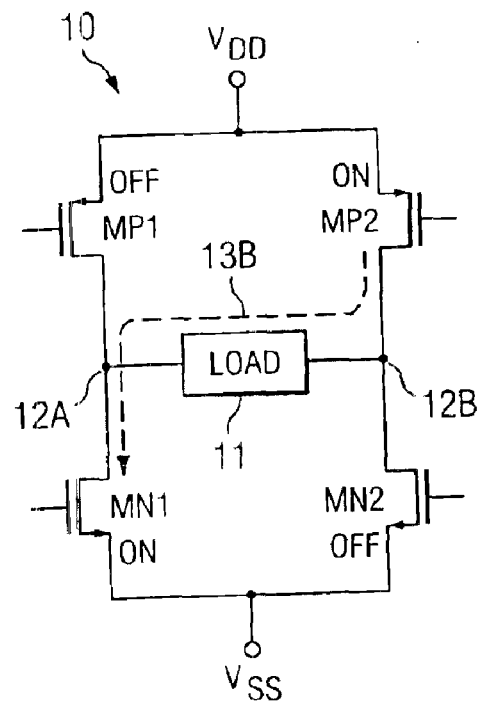

FIG. 2A shows an H-bridge circuit 10 including two P-channel output transistors MP1 and MP2 having their sources connected to VDD. The gates of transistors MP1 and MP2 are controlled by conventional control circuitry (not shown). The drain of transistor MP1 is connected by a conductor 12A to one terminal of a load device 11 and to the drain of an N-channel output transistor MN1, and the drain of transistor MP2 is connected by a conductor 12B to the other terminal of load device 11 and to the drain of an N-channel output transistor MN2. The sources of transistors MN1 and MN2 are connected to VSS. The gates of transistors MN1 and MN2 are also controlled by the above-mentioned conventional control circuitry. In normal operation transistors MP1 and MN2 may be simultaneously on, with the other two transistors MP2 and MN1 being off, as shown in FIG. 2A, or transistors MP2 and MN1 may be simultaneously on, with the other two transistors MP1 and MN2 being off, as shown in FIG. 2B. Thus, H-bridge circuit 10 can be used to reverse the flow of current through the load 11. Transistors MP1 and MN2 in H-bridge circuit 10 can be segmented and "interdigitated" into alternately located sections in the same manner shown in FIG. 3. Transistors MP2 and MN1 in H-bridge circuit 10 also can be segmented and "interdigitated" into alternately located sections in the same manner shown in FIG. 3. By interdigitating these four transistors, the heating that occurs during conduction of one of the pairs is spread over a common area, which substantially reduces localized peak temperatures in the hot spot areas.

FIG. 3 shows the topography of the output stage chip area 50 indicated in FIG. 1B. P-channel output transistor MP1 of FIG. 1B includes a first group of 12 sections or segments MP1-1,2 . . . 12, the sources, drains, and gates of which are all connected to form the source, drain, and gate electrodes, respectively, of P-channel transistor MP1. Similarly, N-channel transistor MN1 includes a second group of 12 sections or segments MN1-1,2 . . . 12, the sources, drains, and gates of which are all connected to form the source, drain, and gate electrodes, respectively, of N-channel transistor MN1. The size of each of P-channel sections MP1,2 . . . 12 and the size of each of N-channel sections MN1,2 . . . 12 are selected so they can safely conduct the same amount of output current to or from output conductor 5.

The sections MP1-1,2 . . . 12 of the first group are disposed in a plurality of N-type well regions 35, respectively. Each N-type well region 35 is surrounded by a P-type moat or isolation region 35A. All of the source regions "S" in the sections MP1-1,2 . . . 12 are electrically connected together by the source electrode of transistor MP1, which is formed by a layer of integrated circuit metallization (not shown) formed on an insulating oxide layer (not shown) over the chip area 50 shown in FIG. 3 and extending through contact openings in the oxide layer to electrically contact each source region S. Similarly, all of the drain regions "D" in each of the sections MP1-1,2 . . . 12 are electrically connected together by the drain electrode of transistor MP1, which is formed by a layer of integrated circuit metallization extending through contact openings in the oxide layer to electrically contact each drain region D. Finally, all of the gates "G" in each of the sections MP1-1,2 . . . 12 are electrically connected together by the gate electrode of transistor MP1, which is formed by a layer of integrated circuit metallization extending through contact openings in an insulating oxide layer to electrically contact each gate G.

Similarly, the sections of the second group MN1-1,2 . . . 12 are disposed in a plurality of P-type well regions 36, respectively. Each P-type well region 36 is surrounded by a P-type moat or isolation region 36A. All of the source regions "S" in the sections MN1-1,2 . . . 12 are electrically connected together by the source electrode of transistor MN1, which is formed by a layer of integrated circuit metallization extending through contact openings in the oxide layer to electrically contact each source region S. Similarly, all of the drain regions "D" in each of the sections MN1-1,2 . . . 12 are electrically connected together by the drain electrode of transistor MN1, which is formed by a layer of integrated circuit metallization extending through contact openings in the oxide layer to electrically contact each drain region D. Finally, all of the gates "G" in each of the sections MN1-1,2 . . . 12 are electrically connected together by the gate electrode of transistor MN1, which is formed by a layer of integrated circuit metallization extending through contact openings in the oxide layer to electrically contact each gate G. It should be understood that the structure shown in FIG. 3 represents only one of a number of possible integrated circuit device structures in which the segments of P-channel transistor MP1 and N-channel transistor MN1 can be interdigitated, and that wafer process engineers skilled in the art can provide various other device structures wherein transistors MP1 and MN1 can be implemented as segmented, interdigitated devices as shown in FIG. 3, depending on the specific process technology used.

The P-channel sections of the first group and the N-channel sections of the second group are alternately located channel in chip area 50 in both the horizontal and vertical directions as shown in FIG. 3 so as to form a kind of checkerboard or modified checkerboard pattern in the interdigitated output stage area 50, such that the higher amount of heat normally generated in the N-channel transistor is spread over the entire interdigitated output stage area 50 in order to reduce peak temperatures in N-channel transistor MN1. The rectangle 45 in the center of area 50 shows the general location of the peak temperatures in area 50 when a large load current is supplied by complementary output stage 4A. Two resistors R1 and R2 and MP and transistor Q1 utilized to sense the temperature within hot spot 45 are located in the center of area 50 where "R1,R2, Q1" is shown in FIG. 3. (Note that in FIG. 3, the upper edge portion of each of sections MP1,2 . . . etc. as illustrated has been enlarged slightly but unrealistically in order to allow the various reference characters MP1,2 . . . etc. to be conveniently included.)

Increasing the number of sections into which transistors MP1 and MN1 are segmented and arranging the segments into any suitable interdigitated topography has the effect of increasing the uniformity of the thermal spreading of heat across the chip away from the output stage area in which transistors MP1 and MN1 are located. The increased uniformity of thermal spreading of dissipated heat from transistors MP1 and MN1 results in advantages which are subsequently explained.

Although the output stage chip area 50 shown in FIG. 3 is generally rectangular, various non-rectangular configurations for output stage chip area 50 could be readily provided in which the various segments of output transistors MP1 and MN1 are similarly interdigitated.

The topographical structure of integrated circuit area 50 in FIG. 3 also can be utilized to implement each of the above mentioned output transistor pairs MP1-MN2 and MP2-MN1 of H-bridge circuit 10 shown in FIGS. 2A and 2B.

Figure 4A:
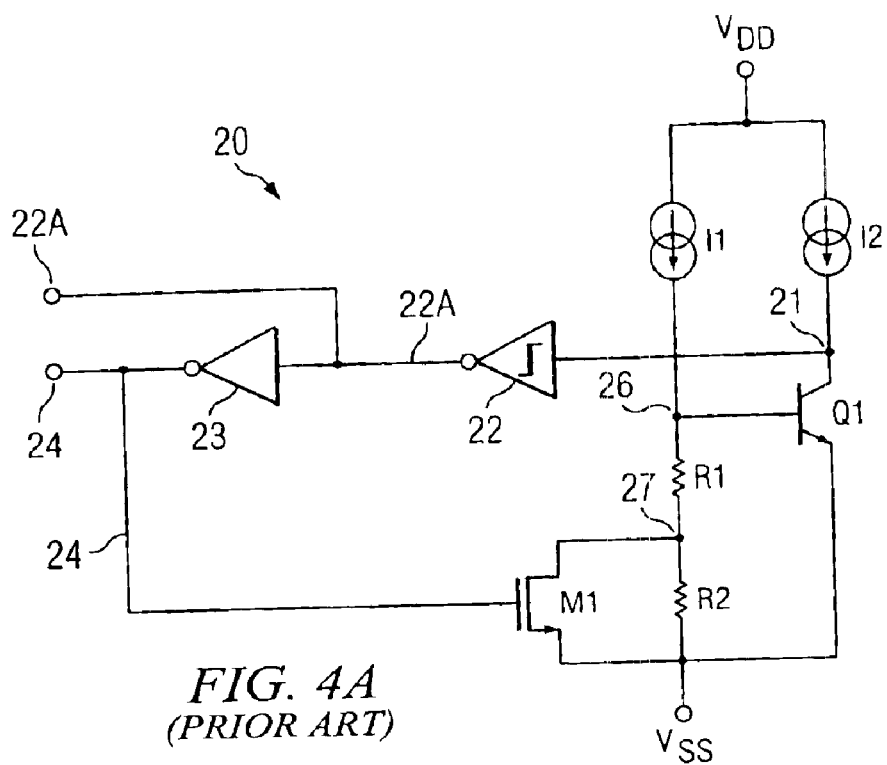
FIG. 4A is schematic diagram of a conventional thermal shut-down circuit that can be used in conjunction with the circuits shown in FIGS. 1A, 1B, 2A, and 2B.

Referring to FIG. 4A, the previously mentioned conventional thermal shutdown circuit 20 includes the above mentioned NPN transistor Q1 located in hot spot region 45 shown in FIG. 3. The emitter of transistor Q1 is connected to VSS. The base of transistor Q1 is connected by conductor 26 to one terminal of a current source I1 and to one terminal of the above-mentioned resistor R1 located in hot spot region 45. The other terminal of resistor R1 is connected by conductor 25 to one terminal of above mentioned resistor R2 in hot spot region 45 and to the drain of an N-channel transistor M1, the source of which is connected to VSS. The second terminal of resistor R2 also is connected to VSS. The drain of transistor Q1 is connected by conductor 21 to the input of an inverting Schmidt trigger circuit 22 and to one terminal of a current source I2. The second terminals of current sources I1 and I2 are connected to VDD.

Figure 4B:
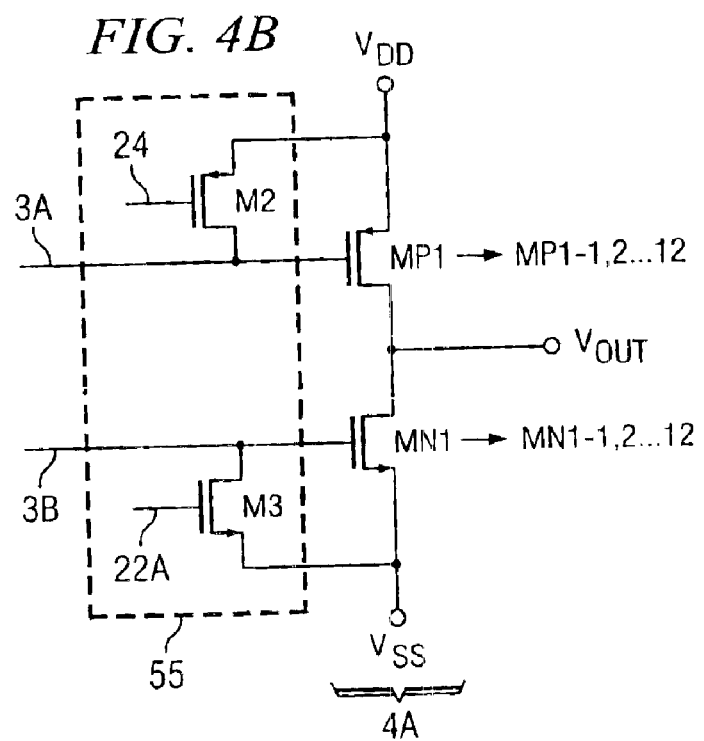
FIG. 4B is a schematic diagram including an interface circuit 55 connected between the thermal shut-down circuit of FIG. 4A and the gates of the output transistors in FIG. 1B.

The output of Schmidt trigger circuit 22 is connected by conductor 22A to the input of inverter 23, the output of which is connected by conductor 24 to the gate of transistor M1 and to an input of an interface circuit 55 shown in FIG. 4B which shuts down the output stage 4A of FIG. 1B by turning off output transistors MP1 and MN1 in response to a to a low voltage on conductor 24. The circuitry including Schmidt trigger circuit 22, inverter 23, and transistor M1 provides hysteresis so that thermal shut-down particular occurs at a particular first predetermined temperature, for example 160 degrees centigrade, and "thermal turn-on" occurs at a particular second predetermined temperature, for example 140 degrees centigrade. Therefore, thermal shut-down circuit 20 does not oscillate around the trip point temperature at which transistor Q1 is turned on.

Current source I1 may be either a PTAT (proportional to absolute temperature) current source or a ZTC (zero temperature coefficient) current source. If current source I1 is a ZTC current source and resistors R1 and R2 do not vary significantly with temperature, then the voltage on conductor 26 will be constant with respect to temperature. A basic characteristic of transistor Q1 is that the turn-on voltage VBE will decrease with temperature. As the chip temperature increases, the voltage on conductor 26 increases and the turn-on voltage of transistor Q1 decreases until the temperature in hot spot region 45 reaches a level at which transistor Q1 simultaneously turns on. This causes the voltage on conductor 21 to decrease, producing a high voltage on conductor 22A and a low voltage on conductor 24. This turns transistor M1 off. The additional resistance represented by the off condition of N-channel transistor M1 increases the voltage on conductor 26. The causes the trip point temperature for resetting thermal shut-down circuit 20 to be lower than the original trip point temperature required to turn transistor Q1 on. If current source I1 is a PTAT current source, then the voltage on conductor 26 will increase with respect to temperature, and the turning on a of transistor Q1 will be much "sharper" with respect to increasing temperature of hot spot region 45.

Referring to FIG. 4B, interface circuit 55 includes a P-channel shut-down transistor M2 having its source connected to VDD, its drain connected to the gate of output transistor MP1 of FIG. 1B by conductor 3A, and its gate connected to conductor 24 of thermal shut-down circuit 20. Interface circuit 55 also includes a N-channel shut-down transistor M3 having its source connected to VSS, its drain connected to the gate of output transistor MN1 of FIG. 1B by conductor 3B, and its gate connected to conductor 22A of thermal shut-down circuit 20.

Interface circuit 55 operates in response to a low voltage signal produced on conductor 24 when an excessively high temperature is sensed by transistor Q1 in thermal shut-down circuit 20. The low voltage signal on conductor 24 turns on shut-down transistor M2. This causes the voltage on conductor 3A to increase to VDD, which turns off output transistor MP1. At the same time that the above mentioned low voltage signal is present on conductor 24 of thermal shut-down circuit 20, the voltage on conductor 22A is at a high level. The high voltage on conductor 22A turns shut-down transistor M3 on, which causes the voltage on conductor 3B to go to VSS. This turns off transistor MN1. Thus, if an excessively high voltage in hot spot region 45 of FIG. 3 is detected by transistor Q1, the thermal shut-down circuit 20 and interface circuit 55 operates to turn off complementary output stage 4A.

Figure 5:
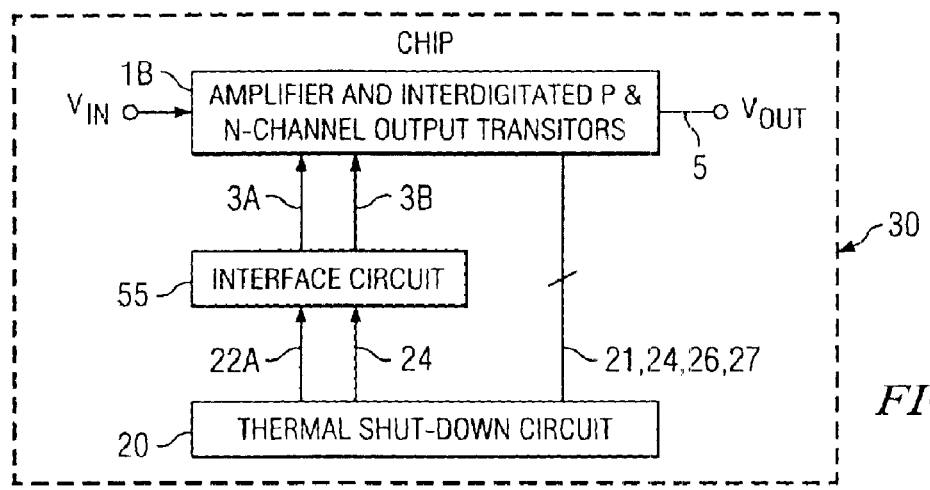
FIG. 5 is a block diagram of an integrated circuit chip including the amplifier circuit 1B of FIG. 1B, the interface circuit 55 of FIG. 4B, and the thermal shut-down circuit 20 of FIG. 4A.

Referring to FIG. 5, an integrated circuit chip 30 includes the amplifier 1B shown in FIG. 1B, thermal shut-down circuit 20 shown in FIG. 4A, and the interface circuit 55 shown in FIG. 4B. Thermal shut-down circuit 20 applies the shut-down signal on conductors 24 and 22A to corresponding inputs of interface circuit 55 and is connected by means of conductors 21, 25, 26, and 27 to resistors R1 and R2 and transistor Q1, which are located inside amplifier 1B.

With the earlier description of the operation of prior art amplifier 1A of FIG. 1A in mind, it can be recognized that utilizing the segmented, interdigitated output transistor structure shown in integrated circuit chip area 50 of FIG. 3 to implement output stage 4A in FIG. 1B provides much more rapid and uniform dissipation of power being generated in N-channel transistor MN1 and therefore prevents transistor Q1 of shut-down circuit 20 from turning on during normal operation, and therefore prevents the regions 41 and 42 of FIG. 6 from occurring. This avoids periods of non-operation of the integrated circuit chip and periods of noise associated with thermal shut-down, and also results in a much more uniform temperature profile throughout the integrated circuit chip. The uniform temperature profile results in reduced harmonic distortion.

Figure 7:
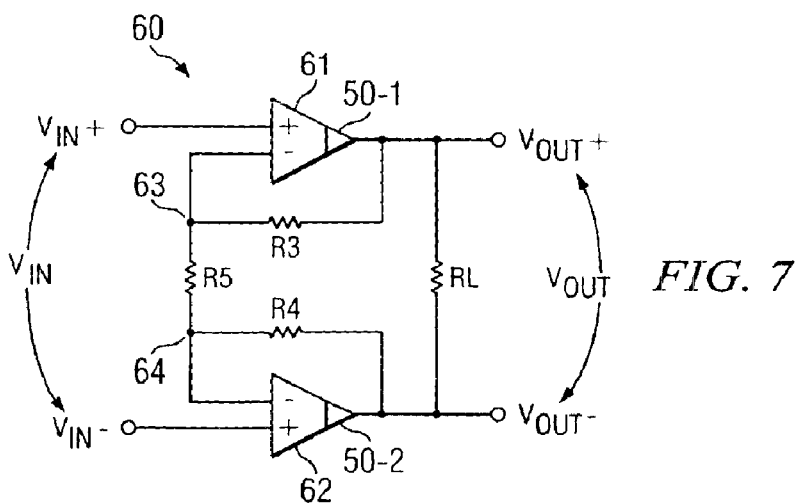
FIG. 7 is a schematic diagram of a fully differential amplifier which includes two interdigitated output stages of the kind shown in FIG. 3 and which provides substantially reduced harmonic distortion as a result of use of the interdigitated output transistor stages.

FIG. 7 shows a fully differential amplifier 60 including a first differential amplifier stage 61 having an interdigitated output stage 50-1 of the kind generally shown in FIG. 3. Fully differential amplifier 60 includes a second differential amplifier stage 62 having an interdigitated output stage 50-2 of the kind shown in FIG. 3. The (+) input of differential amplifier stage 61 receives an input voltage Vin+, and the (−) input of differential amplifier stage 61 is connected by conductor 63 to one terminal of each of resistors R3 and R5. The other terminal of resistor R3 is connected to the output Vout+ produced by interdigitated complementary output stage 50-1 of differential amplifier 61. Similarly, the (+) input of differential amplifier stage 62 receives an input voltage Vin−, and the (−) input of differential amplifier stage 62 is connected by conductor 64 to the other terminal of resistors R5 and to one terminal of a feedback resistor R4. The other terminal of resistor R4 is connected to the output Vout− produced by interdigitated complementary output stage 50-2 of differential amplifier 62. The output voltage Vout applied across a load resistor RL coupled between Vout+ and Vout− is equal to Vout+ minus Vout−.

Certain errors signals are common to the output of a fully differential circuit. Because the output signal Vout across RL is equal to Vout+ minus Vout−, any error signal that is common to Vout+ and Vout− is canceled by the common mode rejection inherent to fully differential circuits. Any systematic error signals caused by amplifier 61 and amplifier 62 in an integrated circuit chip usually will be essentially identical, and will be rejected by the type of fully differential circuit shown in FIG. 7. The input offset voltages of amplifiers 61 and 62 would be examples of systematic error errors that would produce errors signals which would be ordinarily canceled by common mode rejection. There can be "input-referred distortion mechanisms" associated with amplifiers 61 and 62 which result in even-ordered distortion characteristics that appear in Vout+ and Vout− and are rejected by common mode rejection, because typically the even-ordered distortion components are "in-phase" and produce the same output signal components in both Vout+ and Vout−. Therefore, even-ordered harmonics are canceled by the inherent common mode rejection.

A typical cause of even-ordered harmonic signals is thermally-induced errors. If the power dissipation for positive and negative swings of the output signal Vout is matched, any power dissipation will induce the same error, regardless of whether the present swing of Vout is positive or negative. For example, in fully differential amplifier 60 of FIG. 7, there could be thermally induced errors in feedback resistors R3 and R4, but because the current flowing through those resistors would be the same for positive and negative swings of Vout, the effects of those errors would be canceled by common mode rejection. Also, the output transistors of amplifiers 61 and 62 produce thermal gradients which are fed back to the (−) inputs of amplifiers 61 and 62. Generally, because of the way the circuit components are laid out in the integrated circuit topography of a circuit such as fully differential amplifier 60 in FIG. 7, the same errors will be present in both of amplifiers 61 and 62. Therefore, if the output transistors of amplifiers 61 and 62 have the same thermal characteristics when either sourcing or sinking output current, distortion that would otherwise appear in Vout is canceled by common mode rejection. This is the case even though the circuitry is not symmetrically located on the integrated circuit chip with respect to a thermal centerline, which as a practical matter is very advantageous. This assumes that mid-rail common mode biasing is provided for Vout, which usually is the case for this type of differential circuitry, in order to achieve maximum voltage swing for Vout.

An advantage of the present invention is that the thermal power dissipation characteristics of the output stage are the same when it is sourcing current to the load as when it is sinking current from the load. This is in contrast to the situation for most prior art circuits, because in the prior art, the P-channel output transistor and the N-channel output transistor are located at different places on the integrated circuit chip and the P-channel output transistor does not have the same thermal characteristics as the N-channel output transistor and therefore generates different thermal gradients than the N-channel output transistor. This problem of prior art is largely solved by using the interdigitated topography of the present invention because it provides substantially the same temperature gradients across the chip both when the output stage is sourcing current to the load and when it is sinking current from the load.

The use of the interdigitated complementary output stage 4A as shown in FIG. 1B or the chip area arrangement 50 as shown in FIG. 3 may, in some output power situations, allow the elimination of the usual thermal shut-down circuitry. In an output stage in which there is never a need for thermal shut-down, use of the output stage 4A with the topography 50 shown in FIG. 3 will provide uniform temperature gradients across the chip and therefore can reduce internal input offset voltages and can reduce harmonic distortion, especially in differential stages.

The described invention avoids the above described problems of high localized temperatures in N-channel output transistors in a wide variety of integrated circuits with high-power output stages, provides a complementary output transistor stage having an approximately 50 percent improvement in power handling capability than conventional complementary output stages, and avoids undesired thermal shutdown during normal operation of such integrated circuits. This benefit is accomplished without significantly increasing the physical size of the output stage area 50.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, even if the P-channel transistor and the N-channel transistor are of the same size, the above described interdigitated output transistor structure and method has the advantage of providing uniform heating over the output stage area. Therefore, any heat traveling toward the input stage on a centerline of the chip will result in uniform temperatures and gradients about the centerline regardless of which of the P-channel transistor and the N-channel transistor is turned on.

What is claimed is:

1. An integrated circuit comprising:
   (a) a P-channel transistor composed of a first group of sections;
   (b) an N-channel transistor composed of a second group of sections; and
   (c) the sections of the first group being alternately located with respect to the sections of the second group so as to form a generally checkerboard pattern in a first interdigitated output stage area of the integrated circuit including the P-channel transistor and the N-channel transistor wherein heat normally generated in the N-channel transistor is dissipated over the entire interdigitated output stage area to reduce peak temperatures in the N-channel transistor.

2. The integrated circuit of claim 1 including a fully differential amplifier including a first differential input stage including a first interdigitated output stage including the P-channel transistor and the N-channel transistor, and also including a second differential input stage including a second interdigitated output stage substantially similar to the first interdigitated output stage.

3. An integrated circuit comprising:
   (a) a P-channel transistor composed of a first group of sections, each section of the first group including a source region, a drain region, and a gate;
   (b) a plurality of N-type well regions in which the sections of the first group are respectively disposed, the source regions in the first group all being electrically connected together, the drain regions in the first group all being electrically connected together, and the gates in the first group all being electrically connected together;
   (c) an N-channel transistor composed of a second group of sections, each section of the second group including a source region, a drain region, and a gate;
   (d) a plurality of P-type well regions in which the sections of the second group are respectively disposed, the source regions in the second group all being electrically connected together, the drain regions in the second group all being electrically connected together, and the gates in the second group all being electrically connected together; and
   (e) the sections of the first group being alternately located with respect to the sections of the second group so as to form a generally checkerboard pattern in an interdigitated output stage area of the integrated circuit including the P-channel transistor and the N-channel transistor wherein heat normally generated in the N-channel transistor is dissipated over the entire interdigitated output stage area to reduce peak temperatures in the N-channel transistor.

4. The integrated circuit of claim 3 including a fully differential amplifier including a first differential input stage including a first interdigitated output stage including the P-channel transistor and the N-channel transistor, and also including a second differential input stage including a second interdigitated output stage substantially similar to the first interdigitated output stage.

5. The integrated circuit of claim 3 wherein the sections of the first group and the sections of the second group are disposed in a generally rectangular surface area of the integrated circuit including a complementary output stage that includes the P-channel transistor and the N-channel transistor.

6. The integrated circuit of claim 3 wherein the sections of the first group and the sections of the second group are disposed in a generally rectangular surface area of integrated circuit including an H-bridge circuit, wherein the P-channel transistor and the N-channel transistor are transistors that are simultaneously in an on condition during normal operation of the H-bridge circuit.

7. The integrated circuit of claim 3 wherein the safe current-conducting capabilities of the P-channel transistor and the N-channel transistor are approximately equal.

8. The integrated circuit of claim 3 including a temperature-sensing transistor of a thermal shut-down circuit located within a hot spot region in which the highest temperatures would be most likely to occur during operation of the integrated circuit.

9. The integrated circuit of claim 7 wherein the temperature-sensing transistor is part of a shut-down circuit included in the integrated circuit and configured to turn off the P-channel transistor and the N-channel transistor for at least a predetermined amount of time if the temperature within the hot spot region increases to a predetermined level that activates the shut-down circuit.

10. The integrated circuit of claim 9 wherein the predetermined level is greater than approximately 150 degrees centigrade.

11. The integrated circuit of claim 3 wherein the number of sections of the first group is equal to the number of sections of the second group.

12. The integrated circuit of claim 3 where the sections of the first group and the sections of the second group are generally rectangular.

13. The integrated circuit of claim 3 wherein the generally checkerboard pattern in the interdigitated output stage area is generally square.

14. The integrated circuit of claim 3 including a plurality of P-type moat regions surrounding the plurality of N-type well regions, respectively, and a plurality of N-type moat regions surrounding the plurality of P-type well regions, respectively.

15. The integrated circuit of claim 4 wherein the first differential input stage includes a first input coupled to receive a first input signal, a second input coupled by a first conductor to a first terminal of a first resistor and to a first terminal of a second resistor, and an output coupled to a second terminal of the first resistor, and wherein the second differential input stage includes a first input coupled to receive a second input signal, a second input coupled by a second conductor to a first terminal of a third resistor and to a second terminal of the second resistor, and an output coupled to a second terminal of the third resistor.

16. A method of reducing peak hot spot temperatures in an integrated circuit comprising:
   (a) segmenting a P-channel transistor into a first group of sections;
   (b) segmenting an N-channel transistor into a second group of sections; and
   (c) alternately locating the sections of the first group with respect to the sections of the second group so as to form a generally checkerboard pattern in an interdigitated output stage area of the integrated circuit including the P-channel transistor and the N-channel transistor wherein heat normally generated in the N-channel transistor is dissipated over the entire interdigitated output stage area to reduce peak temperatures in the N-channel transistor.

17. The method of claim 16 including arranging the sections of the first group and the sections of the second group in a generally rectangular surface area of the integrated circuit including a complementary output stage that includes the P-channel transistor and the N-channel transistor.

18. The method of claim 17 including arranging the sections of the first group and the sections of the second group in a generally rectangular surface area of integrated circuit including an H-bridge circuit, wherein the P-channel transistor and the N-channel transistor are transistors that are simultaneously in an on condition during normal operation of the H-bridge circuit.

19. The method of claim 18 including configuring the P-channel transistor and the N-channel transistor so that there safe current-carrying capabilities are approximately equal.

20. The method of claim 16 including providing a temperature-sensing transistor of a thermal shut-down circuit located within a hot spot region in which the approximately the highest temperatures would be most likely to occur during operation of the integrated circuit.

21. The method of claim 20 including operating a thermal shut-down circuit to turn off the P-channel transistor and the N-channel transistor for at least a predetermined amount of time if the temperature within the hot spot region increases to a predetermined level that activates the shut-down circuit.

22. The method of claim 21 wherein the predetermined level is greater than approximately 150 degrees centigrade.

23. The method of claim 16 including providing an equal number of sections of the first and second groups.

24. A method of manufacturing an integrated circuit an integrated circuit comprising:
   (a) segmenting a P-channel transistor into a first group of sections;
   (b) segmenting an N-channel transistor into a second group of sections; and
   (c) alternately locating the sections of the first group with respect to the sections of the second group so as to form a generally checkerboard pattern in an interdigitated output stage area of the integrated circuit including the P-channel transistor and the N-channel transistor wherein a higher amount of heat normally generated in the N-channel transistor is dissipated over the entire interdigitated output stage area to reduce peak temperatures in the N-channel transistor.

25. The method of claim 24 including forming temperature-sensing means of a thermal shut-down circuit located within a hot spot region in which the approximately the highest temperatures would be most likely to occur during operation of the integrated circuit.

26. The method of claim 25 wherein the temperature-sensing means is part of a shut-down circuit included in the integrated circuit and configured to turn off the P-channel transistor and the N-channel transistor for at least a predetermined amount of time if the temperature within the hot spot region increases to a predetermined level that activates the shut-down circuit.

27. A method of reducing harmonic distortion in an integrated circuit comprising:
   (a) segmenting a P-channel transistor into a first group of sections;
   (b) segmenting an N-channel transistor into a second group of sections; and
   (c) alternately locating the sections of the first group with respect to the sections of the second group so as to form a generally checkerboard pattern in an interdigitated output stage area of the integrated circuit including the P-channel transistor and the N-channel transistor wherein heat generated in the N-channel transistor and the P-channel transistor is dissipated over the entire interdigitated output stage area so as to reduce peak temperatures and so as to produce a uniform temperature profile across the integrated circuit.

* * * * *